United States Patent
Avalur

(10) Patent No.: US 8,040,160 B2
(45) Date of Patent: Oct. 18, 2011

(54) DRIVER ARRANGEMENT AND SIGNAL GENERATION METHOD

(75) Inventor: Krishna Kanth Gowri Avalur, Hyderabad (IN)

(73) Assignee: austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/399,347

(22) Filed: Mar. 6, 2009

(65) Prior Publication Data

US 2009/0224808 A1 Sep. 10, 2009

(30) Foreign Application Priority Data

Mar. 7, 2008 (EP) ..................................... 08152438

(51) Int. Cl.
*H03B 1/00* (2006.01)

(52) U.S. Cl. ........................................ 327/108; 327/112

(58) Field of Classification Search .......................... None
See application file for complete search history.

(56) References Cited

U.S. PATENT DOCUMENTS

| 5,886,554 | A | 3/1999 | Corsi et al. | |
|---|---|---|---|---|
| 7,688,113 | B2 * | 3/2010 | Nascimento et al. | 326/82 |
| 2004/0141560 | A1 * | 7/2004 | Koyasu | 375/257 |

FOREIGN PATENT DOCUMENTS

| WO | WO 02/073804 | 9/2002 |
|---|---|---|
| WO | WO 02/073912 | 9/2002 |

OTHER PUBLICATIONS

J.M. Redoute et al., "An EMI Resisting LIN Driver in 0.35-micron High-Voltage CMOS", IEEE Journal of Solid-State Circuits, vol. 42, No. 7, pp. 1574-1582, Jul. 2007.
"Line Driver/Receiver", LIN Physical Layer Spec, Revision 2.1, pp. 117-122, Nov. 24, 2006.
A. Vilas Boas et al., "Temperature Compensated Digitally Trimmable On-Chip IC Oscillator with Low Voltage Inhibit Capability", 2004 IEEE, pp. I-501-I-504.

* cited by examiner

*Primary Examiner* — Tuan T Lam
(74) *Attorney, Agent, or Firm* — Cozen O'Connor

(57) ABSTRACT

A driver arrangement comprises a charge pump based oscillator (OSC) having a first charging element (CE1) with a first capacitance (C1) for generating an oscillator signal depending on a first capacitance (C1) and on a first charging current (I1). A controllable current source (CCS) is configured to generated a first and a second charging current (I1, I2) depending on a current control signal, wherein first and second charging currents (I1, I2) have a first predetermined scaling ratio ($\alpha$). The current control signal is provided by a control unit (CTL). An output circuit (DRV) of the driver arrangement comprises a second charging element (CE2) having a second capacitance (C2). The output circuit (DRV) is configured to generate an output signal depending on a data signal (TXD), on the second charging current (I2) and on the second capacitance (C2). Herein, the second capacitance (C2) has a second predetermined scaling ratio ($\beta$) with respect to the first capacitance (C1).

13 Claims, 2 Drawing Sheets

DRIVER ARRANGEMENT AND SIGNAL GENERATION METHOD

RELATED APPLICATION

This application claims the priority of European patent application no. 08152438.1 filed Mar. 7, 2008, the entire content of which is hereby incorporated by reference.

FIELD OF THE INVENTION

The invention relates to a driver arrangement for generating an output signal on a data bus. The invention further relates to a signal generation method.

BACKGROUND OF THE INVENTION

Electronic sensors and respective control units communicate, for example, over a bus system. To this end, data to be transmitted are coded as a binary signal which is generated on the data bus. There are several standards for such bus systems like Controller Area Network, CAN, Local Interconnect Network, LIN, or others.

For example, a LIN-bus can be used in automotive applications. It has a concept of a single master and multiple slaves connected to a single bus wire. The bus wire is electrically connected to the supply voltage which usually is positive with respect to a ground voltage by means of a pull-up resistor. The bus wire is kept in a recessive voltage level corresponding to a relatively high positive voltage near to the positive supply voltage by this pull-up resistor. Master and slave units usually comprise a built-in line driver for pulling down the voltage on the bus wire to a dominant voltage level corresponding to a relatively low positive voltage near to the ground voltage level in response to a data signal. According to the LIN standard, a respective LIN cluster can have up to sixteen slave units being connected to a master unit by the bus wire.

For bus systems, especially in automotive networks, there can be stringent requirements on the electromagnetic emissions of the output drivers generating the signal on the bus system. Fast rising or failing transients on the bus networks can be a major source of energy emission since they generate many high-frequency components. Turning on or off respective drivers instantly can result in undesirable overshoots or undershoots in supply and ground. Thus, these fast transitions can be a major source of electromagnetic emissions and, therefore, radio frequency disturbances on the bus wire. Such disturbances can result in misinterpretation of the recessive and dominant voltage levels on the bus wire.

Furthermore, an asymmetrical propagation delay between the rising and the falling edges of the bus signal can cause a duty cycle different from a usually desired value of 50%.

Both these issues can be a cause for faulty communication. To this end, some bus standards like the LIN standard determine ranges for duty cycles and propagation delays. Respective rise times and fall times of transitions between a recessive voltage level and a dominant voltage level or between a high and a low state, respectively, of a bus signal can be derived from these standard given values.

In conventional driver arrangements for such bus systems, the rise and fall times depend on the load of the bus wire which, for example, is determined by the number of communication units connected to the bus wire. Furthermore, such driver arrangements can be dependent on PVT variations, i.e. variations of process, voltage and temperature, regarding the rise and fall times.

SUMMARY OF THE INVENTION

It is an object of the invention to provide a driver arrangement and a signal generation method which make it possible to generate a signal on a bus system which is less sensitive to external parameter variations.

In one exemplary embodiment, a driver arrangement comprises a charge pump based oscillator which comprises a first charging element having a first capacitance and which is configured to generate an oscillator signal depending on the first capacitance and on a first charging current. The driver arrangement further comprises a controllable current source which is configured to generate the first charging current depending on a current control signal and to generate a second charging current having a first predetermined scaling ratio with respect to the first charging current. A control unit is configured to generate the current control signal. The driver arrangement comprises an output circuit with a second charging element having a second capacitance. The output circuit is configured to generate an output signal depending on a data signal, on the second charging current and on the second capacitance, wherein the second capacitance has a second predetermined scaling ratio with respect to the first capacitance.

For example, the charge pump based oscillator generates a rectangular oscillator signal, wherein a frequency of the oscillator signal depends on the first capacitance and the first charging current. In one embodiment, the oscillator signal can be derived from a charging state of the first charging element, wherein a time when a specific charging state is achieved depends on the capacitance of the first charging element and the first charging current. The first charging element may be discharged when that specific charging state is reached.

In the output circuit of the driver arrangement, the output signal can be generated by charging and discharging the second charging element with the second charging current. In this case, it depends on the data signal whether the second charging element is charged or discharged. The output signal, which preferably is a binary signal, depends on the charging state of the second charging element, such that a transition between a high state and a low state of the output signal depends on the charging time of the second charging element.

The first and the second charging current are generated as matched currents by the controllable current source, wherein a matching factor between the charging currents is defined by the first predetermined scaling ratio. Therefore, any changes of value of the first charging current result in proportional changes of the second charging current.

Accordingly, the first and the second charging elements are provided as matched elements, for example by fabricating the first and second charging element within the same fabrication process step. The capacitance values of the first and the second charging element have the second predetermined scaling ratio, such that any changes of the first capacitance due to PVT variations result in proportional changes of the second capacitance.

The data signal determines signal shape and signal transitions of the output signal. Accordingly, because of the matching of the charging currents and the charging elements, slew rates of the output signal are directly proportional to the frequency of the oscillator signal even if PVT variations occur in the driver arrangement.

In one embodiment, the controllable current source comprises a first current mirror for deriving the first charging current and a second current mirror for deriving the second charging current from a reference current, respectively. Transistors of such current mirrors can be fabricated matched to each other, for example during one fabrication step. To provide the reference current, the driver arrangement can further comprise a temperature-independent current source which generates a temperature-independent reference current. By such a temperature-independent current source, the dependency of the driver arrangement on temperature variations can be further reduced.

In one embodiment, the controllable current source is configured to generate a first and a second charging currents depending on a current control signal which is thermometer coded or binary coded. To this end, the controllable current source can comprise a plurality of matched current sources which can be switched on or off depending on a control data word comprised by the current control signal.

For a thermometer coded control signal, these current sources can each provide a partial current of the same value which can be combined to the first and the second charging current, respectively. In this case, the thermometer coded control signal determines which of these current sources provides its partial current to the respective charging currents. As the current sources for generating the first charging current and the current sources for generating the second charging current are controlled by the same control signal, a matching of the first and the second charging current or the first scaling factor remains unchanged.

In case the current control signal is a binary coded control signal, the controllable current source can comprise respective current sources which provide partial currents having respective current ratios being a power of two. As for the thermometer coded control signals, the first and the second charging current result from combining currents of the binary coded current sources. Also in this case, a matching of the first and the second charging current with respect to the first predetermined scaling ratio remains unchanged.

In one embodiment, the control unit is configured to generate a current control signal depending on the frequency of the oscillator signal. For example, the oscillator signal can be analyzed by the control unit in a calibration step to derive a current control signal which remains unchanged during operation of the driver arrangement. Furthermore, it is possible to compare a frequency of the oscillator signal with a reference frequency, for example provided by a crystal oscillator, during operation of the driver arrangement and to continuously adapt the current control signal. In other words, a trimming of the charging currents can be performed continuously or during discrete times of operation of the driver arrangement.

In one embodiment, the output circuit comprises first switching means for charging or discharging the second charging element with the second charging current, wherein charging or discharging depends on the data signal, and second switching means for generating the output signal from a supply voltage depending on the charging state of the second charging element.

For example, a signal path can be opened or closed between a connection for providing the supply voltage and a connection coupled to a ground potential by the second switching means. A switching state of the second switching means is determined by the charging state of the second charging element. The first switching means determines whether the second charging element is charged or discharged, which in each case results in a predetermined transition time or slew rate. As the frequency of the oscillator signal is set and controlled by the control unit, the slew rate of the output circuit, which is matched to that oscillating frequency, remains unchanged.

In one embodiment, the charge pump based oscillator comprises a charging input for providing a first charging current, wherein the charging input is coupled to the first charging element. A reference input of the oscillator is provided with a reference voltage. The oscillator further comprises a comparator element with the first input which is coupled to the charging input, a second input which is coupled to the reference input, and an output for providing the oscillator signal. Discharging means are provided for discharging the first charging element depending on the oscillator signal. By comparing the charging voltage of the first charging element with a reference voltage, a rectangular oscillator signal is derived from a sawtooth shaped charging state of the first charging element. The rise time of the charging state therefore determines the frequency of the oscillator signal. The reference voltage is, for example, provided by a band gap circuit.

In an exemplary embodiment of a signal generation method, a first charging current is generated depending on a current control signal. Furthermore, a second charging current is generated having a first predetermined scaling ratio with respect to the first charging current. In other words, also the second charging current depends on the current control signal. An oscillator signal is generated depending on the first charging current and on a first capacitance. An output signal is generated depending on a data signal, on the second charging current, and on a second capacitance which has a second predetermined scaling ratio with respect to the first capacitance.

As both the first and the second charging currents and the first and the second capacitances are matched to each other, respectively, the generation of the output signal is matched to the generation of the generation of the oscillator signal with respect to the respective signal timing. In other words, there is a fixed dependency between a slew rate of the output signal and a frequency of the oscillator signal.

In one embodiment of the signal generation method, the generation of the oscillator signal comprises charging a first charging element having a first capacitance with a first charging current and comparing a charging voltage of the first charging element with a reference voltage. The oscillator signal is derived from the comparison result. Furthermore, the first charging element is discharged depending on the comparison result.

In a further embodiment of the signal generation method, the generation of the output signal comprises charging or discharging a second charging element having a second capacitance with a second charging current. The charging or discharging depends on the data signal. The output signal is generated from a supply voltage in a switching manner depending on the charging state of the second charging element.

BRIEF DESCRIPTION OF THE DRAWINGS

The text below explains the invention in detail using exemplary embodiments with reference to the drawings. Like reference numerals designate corresponding similar parts or elements. In the drawings

DETAILED DESCRIPTION OF THE DRAWINGS

Figure 1:
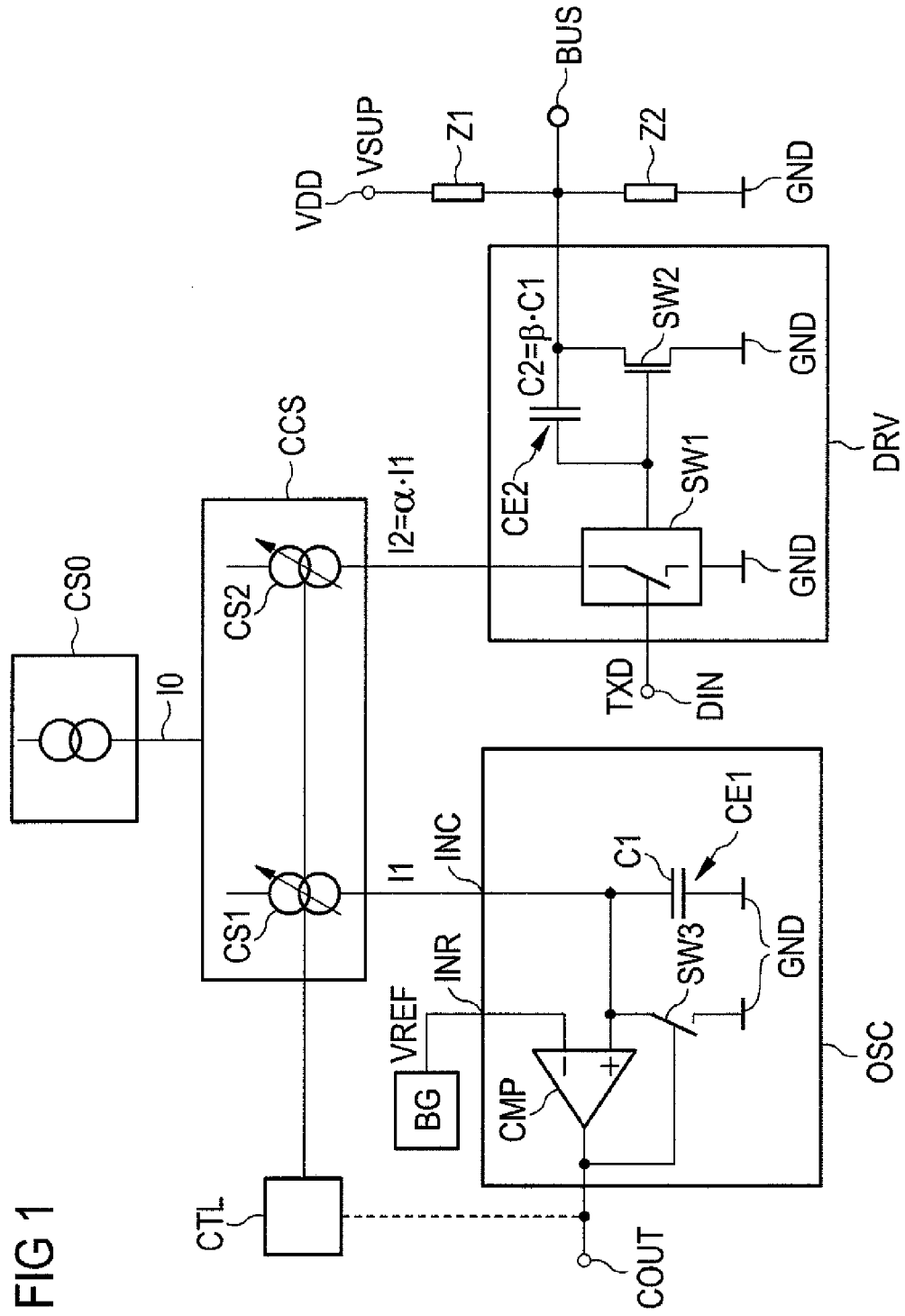
FIG. 1 shows an exemplary embodiment of a driver arrangement.

FIG. 1 shows an exemplary embodiment of a driver arrangement comprising a charge pump based oscillator OSC, a controllable current source CCS, a temperature-independent current source CS0, a control unit CTL, a band gap circuit BG, and an output circuit DRV. The oscillator OSC comprises a charging input INC to which a first charging element CE1 is coupled. The oscillator OSC further comprises a comparator element CMP with a first input + coupled to the first charging element CE1 and to the charging input INC, respectively. A second input − of the comparator element CMP is coupled to a reference input INR. An output COUT of the comparator element CMP and the oscillator OSC, respectively, is coupled to a control input of a switching device SW3 which is provided as a discharging means for the charging element CE1. To this end, the discharging means SW3 is connected in parallel to the first charging element CE1 between the first input + of the comparator element CMP and a reference potential connection GND.

The controllable current sources CCS comprises a first and a second current source CS1, CS2 which are matched to each other and controlled by a current control signal provided by the control unit CTL. The first current source is coupled to the charging input INC of the oscillator OSC and the second current source CS2 is coupled to the output circuit DRV.

The output circuit DRV comprises first switching means SW1 which are coupled between the second current source CS2 and the reference potential connection GND. A control input of the first switching means SW1 is coupled to a data input DIN. An output of the first switching means SW1 is coupled to the first connection of a second charging element CE2 and to a control input of second switching means SW2 which in this embodiment are provided by means of a transistor. A second connection of the second charging element CE2 is coupled to a first terminal of the second switching means SW2 and to a bus connection BUS, wherein a second terminal of the second switching means SW2 is connected to the reference potential connection GND. The bus connection BUS is further coupled to a supply voltage connection VDD via a first impedance Z1 and to a reference potential connection GND via a second impedance Z2.

During operation of the driver arrangement, the temperature-independent current source CS0 provides a reference current I0 to the controllable current source CCS. In the controllable current source CCS, the first and the second matched current sources CS1, CS2 provide a first charging current I1 and a second charging current I2, respectively, each depending on the current control signal provided by the control unit CTL. The first and the second charging current I1, I2 are each derived from the reference current I0. The first and the second current sources CS1, CS2 are matched to each other, such that a ratio between the second charging current I2 and the first charging current I1 is a first predetermined scaling ratio α. In other words, regardless of the actual value of the first charging current I1, the value of the second charging current I2 has a fixed dependency on the first charging current I1, such that $$I2 = \alpha \cdot I1 \qquad (1)$$

The first charging current I1 is provided to the charge pump based oscillator OSC for charging the first charging element CE1 which has a capacitance C1. Accordingly, a temporal charging state of the first charging element CE1 depends on the first charging current I1 and the first capacitance C1. A charging state expressed by a charging voltage VC1 of the first charging element CE1 is compared to a reference voltage VREF by means of the comparator element CMP. If the charging voltage VC1 is larger than the reference voltage VREF, a clock pulse is generated at the output COUT of the comparator element CMP. Depending on this clock pulse, the discharging means SW3 are triggered to discharge the first charging element CE1. Preferably, the first charging element CE1 is fully discharged in this case.

In other words, a sawtooth-like signal is generated within the charge pump based oscillator OSC at the positive input + of the comparator element CMP. At the output COUT of the comparator element CMP, a rectangular clock signal is derived from the sawtooth-like input signal. A frequency of the oscillator signal formed by the output of the comparator element CMP depends on the first charging current I1 and the first capacitance C1. With VC1 being the charging voltage of the first charging element CE1 and t being a time, the charging voltage VC1 produces the result $$VC1 = \frac{I1 \cdot t}{C1} \qquad (2)$$

such that the frequency of oscillation fosc depending on the reference voltage VREF can be written as $$fosc = \frac{1}{t} = \frac{I1}{C1 \cdot VREF} \qquad (3)$$

Introducing a slew rate SR1 of the oscillator OSC, with $$SR1 = \frac{I1}{C1}, \qquad (4)$$

the oscillating frequency fosc produces the result $$fosc = \frac{SR1}{VREF}. \qquad (5)$$

The reference voltage VREF can be provided by a trimmed or an untrimmed band gap circuit, for example depending on a tolerance of a respective application for the driver arrangement. As an alternative, the reference voltage VREF can also be derived from a bandgap voltage, for example by scaling or multiplying that bandgap voltage. Respective bandgap circuits can be comprised by the driver arrangement or provided externally. As a further alternative, the reference voltage VREF can also be provided externally as any fixed voltage.

The output frequency fosc of the oscillator OSC can be analyzed before or during operation of the driver arrangement, for example by a calibration process which is denoted exemplarily by the dashed line between the output COUT and the control unit CTL. Therefore, for a fixed reference voltage VREF, by controlling or trimming the frequency of the oscillator, the ratio I1/C1 gets automatically trimmed. In this embodiment, the trimming or controlling of the frequency is performed by adjusting the first charging current I1 with the current control signal provided by the control unit CTL. It should be noted that by such trimming, also the second charging current I2 is trimmed or adjusted accordingly such that the predetermined scaling ratio α is maintained.

In the output circuit DRV, the first switching means SW1 are controlled by a data signal TXD provided at the data input DIN. A timing of the data signal TXD is preferably derived from the oscillator signal generated by the oscillator OSC. Depending on the data signal TXD, the second charging current I2 is provided to the second charging element CE2 either for charging or discharging the second charging element CE2. To this end, for example, a direction of current flow to or from the second charging element CE2 is controlled by the first switching means SW1.

The second charging element CE2 has a second capacitance C2 which is matched to the first capacitance C1 of the first charging element CE1 such that the second capacitance C2 has a second predetermined scaling ratio α with respect to the first capacitance C1. This can be expressed by $$C2 = \beta \cdot C1. \qquad (6)$$

The impedances Z1, Z2 coupling the bus connection BUS to the supply voltage potential VDD and the reference voltage potential GND form a load seen by the driver arrangement. For example, the impedance Z1 is a resistive load and the impedance Z2 is a capacitive load. If implemented as an LIN bus, the resistive load can vary between 500Ω to 1 kΩ and the capacitive load can vary from 1 nF to 10 nF. Typical combinations of resistive and capacitive loads known in the LIN standard are 1 kΩ-1 nF, 660Ω-5 nF, and 500Ω-10 nF.

The impedance values of the impedances Z1, Z2 determine a recessive voltage level at the bus connector BUS being near to the supply voltage VSUP provided at the supply voltage connection VDD. By controlling a conductance of the signal path formed by the second switching means SW2, the voltage level at the bus connector BUS can be changed to a dominant voltage level being near to a ground level potential of the reference potential connection GND. The time between a fully open and a fully closed state or vice-versa of the second switching means SW2 depends on the charging of the second charging element CE2. In other words, a second slew rate SR2 for switching between two logical states at the bus connector BUS depends on the second charging current I2 and the second capacitance C2. Accordingly, the slew rate SR2 can be written as $$SR2 = \frac{I2}{C2}. \qquad (7)$$

As the first and the second charging current I1, I2 are matched, currents having a dependency noted in equation (1), and first and second capacitances C1, C2 are also matched having the dependency noted in equation (6), the slew rate SR2 can also be written as $$SR2 = \frac{\alpha \cdot I1}{\beta \cdot C1} = \frac{\alpha}{\beta} \cdot SR1, \qquad (8)$$

taking into account also equation (4). So there is a dependency between the first and the second slew rate SR1, SR2 given by the predetermined scaling ratios α, β. Taking further into account equation (5), equation (8) can also be rewritten as $$SR2 = fosc \cdot VREF \cdot K, \qquad (9)$$

wherein K is a constant value depending, i.a. on the predetermined scaling ratios α, β. Therefore, if the oscillating frequency fosc is trimmed to a predetermined value and the reference voltage VREF is a temperature-independent constant voltage, the second slew rate SR2 is automatically trimmed or adjusted with the oscillating frequency OSC. Also, even if PVT variations occur in the driver arrangement, this dependency is still maintained.

In one embodiment of the driver arrangement, the second capacitance C2 is chosen such that influences of the impedances Z1, Z2 on the second slew rate SR2 can be neglected. To this end the second capacitance C2 can have a capacitance value being smaller than the capacitive load of the second impedance Z2. In this case the slew rate SR2 determined by the driver arrangement is slower than an external slew rate determined by the external load Z1, Z2 and the supply voltage VSUP. Therefore a slew rate of the output signal is dominated by the internal slew rate SR2.

Figure 2:
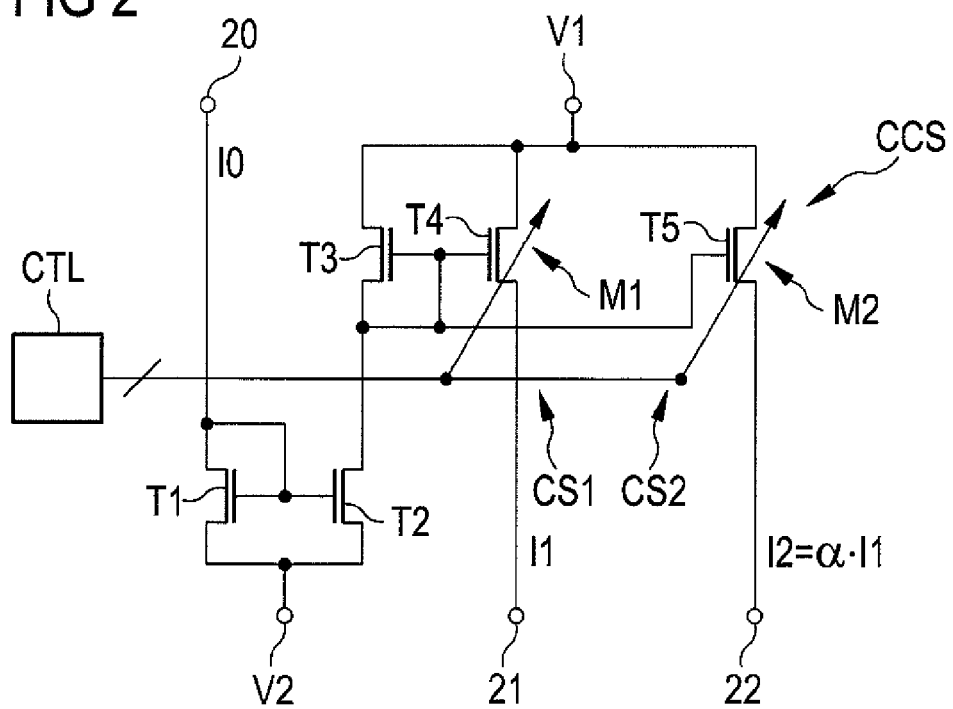
FIG. 2 shows an exemplary embodiment of a controllable current source.

FIG. 2 shows an embodiment of a controllable current source CCS controlled by a control unit CTL. The controllable current source comprises an input 20 for providing the reference current I0, a first and a second transistor T1, T2 which form a current mirror coupled to a voltage connection V2. An output of the current mirror T1, T2 is coupled to an input transistor T3 of a first and a second current mirror M1, M2, wherein a fourth transistor T4 forms an output transistor for the first current mirror M1 and a fifth transistor T5 forms an output transistor for the second current mirror M2. The first and the second current mirror M1, M2 are supplied via a voltage connection V1. Respective outputs of the current mirrors M1, M2 are connected to outputs 21, 22 of the controllable current source CCS.

The output transistors T4, T5 can be embodied as a respective set of equal weighted or binary weighted transistors which can be turned on or off depending on a digital current control signal which is thermometer coded or binary coded, respectively. In any case, the output transistors T4, T5 of the first and the second current mirror M1, M2 are matched to each other such that the first predetermined scaling ratio α between the first and the second charging current I1, I2 is maintained as noted in equation (1) above. In other words, the first and the second current mirror M1, M2 form the first and the second current sources CS1, CS2 shown in FIG. 1. A mirror ratio of the transistors T1, T2 can be any value, as the output current of the current mirror T1, T2 acts as a reference current for both the first and the second charging current I1, I2.

The digital value of the current control signal can be derived in a calibration step after fabrication or even in a start-up phase of the driver arrangement. Furthermore, the current control signal can be adapted continuously during operation of the driver arrangement.

Figure 3:
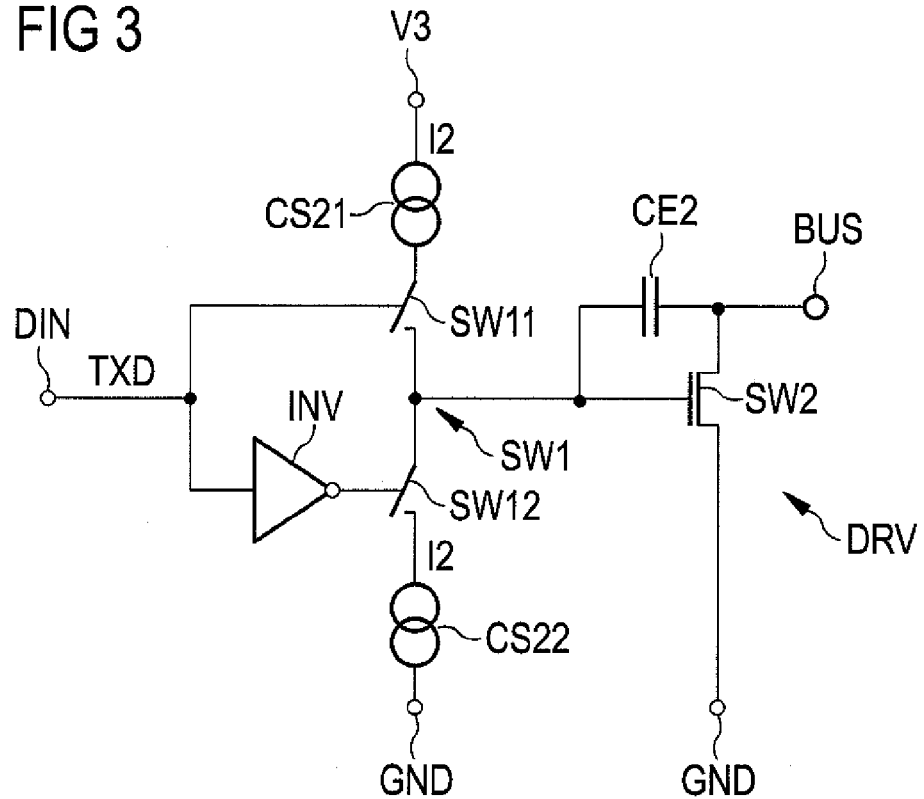
FIG. 3 shows an exemplary embodiment of an output circuit.

FIG. 3 shows an embodiment of an output circuit DRV which can be used in the embodiment of the driver arrangement shown in FIG. 1. The first switching means SW1 of the output circuit DRV comprise a first switch SW11 which is coupled to the data input DIN directly, and a second switch SW12 which is coupled to the data input DIN via an inverter element INV. A current source CS21 is coupled to a voltage input V3 and a current source CS22 is coupled to the reference potential connection GND. A connection between the switches SW11, SW12 forms an output of the first switching means SW1 and is coupled to the second charging element CE2 and the control input of the second switching means SW2.

The current sources CS21, CS22 can be part of or be controlled by the controllable current source CCS such that each of the current sources CS21, CS22 provides the second charging current I2 itself. By closing the switches SW11, SW12 in an alternating fashion depending on the data signal TXD, which is a logical signal, the second charging element CE2 is either charged by current source CS21 or discharged by current source CS22. In each case, a transition between two logical states at the bus connection BUS depends on the charging time or the charging state, respectively, of the second charging element CE2, as described above for FIG. 1.

The charge pump based oscillator OSC shown in FIG. 1 can also be replaced by other implementations of a charge pump based oscillator for which an oscillating frequency depends on a charging current and a capacitances of a charging element. Also other implementations of the controllable current source can be chosen as long as a first and a second charging current I1, I2 with a predetermined scaling ratio α are provided. Furthermore, the embodiment of the output circuit DRV could be varied as long as a slew rate for an output signal to be generated depends on a second charging element and the second charging current. In each case, it is desirable that first and second capacitance C1, C2 are matched as well as possible, especially with regard to PVT variations.

When used as a driver arrangement for a LIN bus, relatively high voltages are used within the driver arrangement being around 42 V approximately. Accordingly, respective dimensioned switching elements in transistors should be chosen in this case. For example, also charging elements or capacitors are chosen preferably for the first and the second charging element CE1, CE2 which can withstand approximately 50 V across its terminals.

The temperature and load independency of the driver arrangement shown in the embodiments above can be achieved without any complex feedback mechanisms. Furthermore, the embodiments described above can be extended to a push-pull driver driving a single via bus or a differential driver driving a differential bus. The driver arrangement according to on of the embodiments described above can be implemented on a single chip, for example as a System on Chip, SOC. Since most SOCs with internal oscillators are trimmed for the frequency, there are no extra costs incurred for trimming procedures. The yield with respect to the slew rate of the output circuit can easily be achieved because of good control on the circuit performance of the driver arrangement with respect to PVT and load variations.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A driver arrangement, comprising:
    a charge pump based oscillator comprising a first charging element having a first capacitance, the oscillator being configured to generate an oscillator signal depending on the first capacitance and on a first charging current;
    a controllable current source configured to generate the first charging current depending on a current control signal and to generate a second charging current having a first predetermined scaling ratio with respect to the first charging current;
    a control unit configured to generate the current control signal; and
    an output circuit comprising a first switching device comprising a first switch coupled directly to a data input, a second switch coupled to the data input through an inverter element, a first current source coupled to a voltage input, a second current source coupled to a reference potential connection and a second charging element having a second capacitance, the output circuit being configured to generate an output signal depending on a data signal provided at the data input, on the second charging current and on the second capacitance, wherein the second capacitance has a second predetermined scaling ratio with respect to the first capacitance, and wherein a connection between the first and second switches forms an output of the first switching device and is coupled to the second charging element and a control input of a second switching device.

2. The driver arrangement according to claim 1, wherein the controllable current source comprises a first current mirror for deriving the first charging current and a second current mirror for deriving the second charging current from a reference current respectively.

3. The driver arrangement according to claim 2, further comprising a temperature independent current source for providing the reference current.

4. The driver arrangement according to claim 1, wherein the controllable current source is configured to generate the first and the second charging current depending on a current control signal which is thermometer coded or binary coded.

5. The driver arrangement according to claim 1, wherein the control unit is configured to generate the current control signal depending on a frequency of the oscillator signal.

6. The driver arrangement according to claim 1, wherein the first switching device of the output circuit is configured to charge or discharge the second charging element with the second charging current, wherein charging or discharging depends on the data signal provided at the data input; and wherein the second switching device of the output circuit is configured to generate the output signal from a supply voltage depending on a charging state of the second charging element.

7. The driver arrangement according to claim 1, wherein the oscillator comprises:
    a charging input for providing the first charging current, the charging input coupled to the first charging element;
    a reference input for providing a reference voltage;
    a comparator element with a first input coupled to the charging input, a second input coupled to the reference input and an output for providing the oscillator signal; and
    discharging means for discharging the first charging element depending on the oscillator signal.

8. The driver arrangement according to claim 7, wherein the reference voltage is provided by a scaled or an unsealed bandgap circuit.

9. A signal generation method, comprising the steps of:
    generating a first charging current depending on a current control signal;
    generating a second charging current having a first predetermined scaling ratio with respect to the first charging current;
    generating an oscillator signal depending on the first charging current and on a first capacitance; and
    generating an output signal depending on a data signal provided at a data input, on the second charging current and on a second capacitance which has a second predetermined scaling ratio with respect to the first capacitance, said generating the oscillator signal comprising the steps of:
        charging a first charging element having the first capacitance with the first charging current;
        comparing a charging voltage of the first charging element with a reference voltage;
        deriving the oscillator signal from the comparison result; and
        discharging the first charging element depending on the comparison result.

10. The signal generation method according to claim 9, wherein generating the output signal further comprises:
    charging or discharging a second charging element having the second capacitance with the second charging current, wherein charging or discharging depends on the data signal provided at the data input; and generating the output signal from a supply voltage in a switching manner depending on a charging state of the second charging element.

11. A driver arrangement, comprising:

a charge pump based oscillator comprising a first charging element having a first capacitance, the oscillator being configured to generate an oscillator signal depending on the first capacitance and on a first charging current;

a controllable current source configured to generate the first charging current depending on a current control signal and to generate a second charging current having a first predetermined scaling ratio with respect to the first charging current;

a control unit configured to generate the current control signal depending on a frequency of the oscillator signal which is trimmed to a predetermined value during a calibration, the current control signal remaining unchanged during operation of the driver arrangement; and an output circuit comprising a second charging element having a second capacitance, the output circuit being configured to generate an output signal depending on a data signal, on the second charging current and on the second capacitance, wherein the second capacitance has a second predetermined scaling ratio with respect to the first capacitance wherein the oscillator signal is generated depending on a reference voltage such that a frequency value of the oscillation is in accordance with the relationship:

$$fosc = \frac{I1}{C1 \cdot VREF},$$

wherein fosc is the frequency value, I1 is a value of the first charging current, C1 is a value of the first capacitance and VREF is a value of the reference voltage.

12. A driver arrangement, comprising:

a charge pump based oscillator comprising a first charging element having a first capacitance, a charging input for providing a first charging current, the charging input being coupled to the first charging element, a reference input for providing a reference voltage, a comparator element with a first input coupled to the charging input, a second input coupled to the reference input and an output for providing an oscillator signal and discharging means for discharging the first charging element depending on the oscillator signal, the oscillator being configured to generate the oscillator signal depending on the first capacitance and on the first charging current;

a controllable current source configured to generate the first charging current depending on a current control signal and to generate a second charging current having a first predetermined scaling ratio with respect to the first charging current;

a control unit configured to generate the current control signal; and an output circuit comprising a second charging element having a second capacitance the output circuit being configured to generate an output signal depending on a data signal, on the second charging current and on the second capacitance, wherein the second capacitance has a second predetermined scaling ratio with respect to the first capacitance.

13. A driver arrangement, comprising:

a charge pump based oscillator comprising a first charging element having a first capacitance, the oscillator being configured to generate an oscillator signal depending on the first capacitance and on a first charging current;

a controllable current source configured to generate the first charging current depending on a current control signal and to generate a second charging current having a first predetermined scaling ratio with respect to the first charging current, the controllable current source comprising a first current mirror for deriving the first charging current and a second current mirror for deriving the second charging current from a reference current, respectively, a transistor forming an input of the first and second current mirrors, a second transistor forming an output transistor of the first current mirror and a third transistor forming an output transistor of the second current mirror;

a control unit configured to generate the current control signal depending on a frequency of the oscillator signal which is trimmed to a predetermined value; and an output circuit comprising a second charging element having a second capacitance, the output circuit being configured to generate an output signal depending on a data signal, on the second charging current and on the second capacitance, wherein the second capacitance has a second predetermined scaling ratio with respect to the first capacitance.

* * * * *